United States Patent
Kim et al.

(10) Patent No.: US 12,336,421 B2
(45) Date of Patent: Jun. 17, 2025

(54) ELECTROLUMINESCENCE DISPLAY INCLUDING BANKS WITH DIFFERENT HEIGHTS

(71) Applicant: LG Display Co., Ltd., Seoul (KR)

(72) Inventors: Dohong Kim, Paju-si (KR); Howon Choi, Paju-si (KR)

(73) Assignee: LG Display Co., Ltd., Seoul (KR)

(*) Notice: Subject to any disclaimer, the term of this patent is extended or adjusted under 35 U.S.C. 154(b) by 268 days.

(21) Appl. No.: 17/528,935

(22) Filed: Nov. 17, 2021

(65) Prior Publication Data

US 2022/0208902 A1 Jun. 30, 2022

(30) Foreign Application Priority Data

Dec. 28, 2020 (KR) .................. 10-2020-0184728

(51) Int. Cl.
| | |
|---|---|
| *H10K 59/88* | (2023.01) |
| *H10K 50/82* | (2023.01) |
| *H10K 50/844* | (2023.01) |
| *H10K 59/122* | (2023.01) |
| *H10K 59/131* | (2023.01) |
| *H10K 59/80* | (2023.01) |

(52) U.S. Cl.
CPC ............ *H10K 59/88* (2023.02); *H10K 50/82* (2023.02); *H10K 50/844* (2023.02); *H10K 59/122* (2023.02); *H10K 59/131* (2023.02); *H10K 59/80521* (2023.02); *H10K 59/873* (2023.02)

(58) Field of Classification Search
None
See application file for complete search history.

(56) References Cited

U.S. PATENT DOCUMENTS

| 10,559,634 | B2 | 2/2020 | Baik et al. | |
|---|---|---|---|---|
| 11,063,096 | B2 | 7/2021 | Heo | |
| 2016/0079323 | A1* | 3/2016 | Choi | H10K 59/122 257/40 |
| 2017/0117337 | A1* | 4/2017 | Kimura | H10K 50/805 |
| 2017/0133443 | A1* | 5/2017 | Nendai | H10K 50/813 |
| 2018/0138435 | A1* | 5/2018 | Kim | H10K 71/13 |
| 2018/0358573 | A1* | 12/2018 | Maeda | H10K 50/15 |

(Continued)

FOREIGN PATENT DOCUMENTS

| KR | 10-1948898 B1 | 2/2019 |
|---|---|---|
| KR | 10-2019-0022100 A | 3/2019 |
| KR | 10-2019-0064051 A | 6/2019 |

*Primary Examiner* — Daniel Whalen
*Assistant Examiner* — Seyon Ali-Simah Punchbeddell
(74) *Attorney, Agent, or Firm* — Fenwick & West LLP

(57) ABSTRACT

The present disclosure relates to an electroluminescence display having ultra-high resolution. The present disclosure, an electroluminescence display according to the present disclosure comprises: a first bank having a first height and a second bank having a second height less than the first height for defining an emission area on a substrate; an anode electrode disposed at the emission area; a light emitting layer disposed on the anode electrode in the emission area; a cathode electrode disposed on the light emitting layer; a first protective layer disposed on the cathode electrode; and a dummy light emitting layer disposed on the second bank. The cathode electrode is disposed on the dummy light emitting layer on the second bank excepting the first bank.

20 Claims, 7 Drawing Sheets

(56) References Cited

U.S. PATENT DOCUMENTS

| | | | |
|---|---|---|---|
| 2019/0067392 A1 | 2/2019 | Baik et al. | |
| 2019/0103442 A1* | 4/2019 | Choi | H10K 50/822 |
| 2019/0103450 A1 | 4/2019 | Heo | |
| 2019/0165068 A1* | 5/2019 | Park | H10K 59/126 |
| 2019/0165326 A1* | 5/2019 | Kim | H10K 59/878 |
| 2019/0181201 A1* | 6/2019 | Kim | H10K 50/828 |
| 2019/0189969 A1* | 6/2019 | Youn | H10K 50/852 |
| 2020/0043997 A1* | 2/2020 | Sonoda | H10K 59/124 |
| 2020/0091459 A1* | 3/2020 | Senoo | H10K 59/124 |
| 2020/0212133 A1* | 7/2020 | Gee | H10K 71/441 |
| 2021/0320150 A1* | 10/2021 | Yang | H10K 59/38 |
| 2022/0254846 A1* | 8/2022 | Shinokawa | G09F 9/00 |

* cited by examiner

ELECTROLUMINESCENCE DISPLAY INCLUDING BANKS WITH DIFFERENT HEIGHTS

CROSS-REFERENCE TO RELATED APPLICATIONS

This application claims the benefit of Republic of Korea Patent Application No. 10-2020-0184728 filed on Dec. 28, 2020, which is hereby incorporated by reference in its entirety.

BACKGROUND

Field of Technology

The present disclosure relates to an electroluminescence display having ultra-high resolution. Especially, the present disclosure relates to an ultra-high resolution electroluminescence display of which display quality is enhanced by reducing the parasitic capacitance between the common voltage line and the data line.

Discussion of the Related Art

Recently, various types of displays such as cathode ray tubes (CRTs), liquid crystal displays (LCDs), plasma display panels (PDPs), and electroluminescent displays have been developed. These various types of display are used to display image data of various products such as computers, mobile phones, bank deposit and withdrawal devices (ATMs), and vehicle navigation systems according to their unique characteristics and purposes.

In particular, the electroluminescent display which is a self-luminous display, has excellent optical performance such as a viewing angle and color realization degree, so that its application field is gradually widening and is receiving attention as an image display device. Especially, an organic light emitting diode display, one of the electroluminescence displays, can implement pure black and pure white chromaticity. With these merits, the organic light emitting diode display is drawing attention as the most suitable display for realizing 4K and even 8K ultra-high resolution display.

When an ultra-high resolution is implemented, the distance between the wirings or lines may become closer, and the thickness of the insulating layer may become thinner. As the result, the gap between the stacked wirings or lines may become narrower, so that the possibility of signal interference may increase. In particular, as the gap between the date lines and the common electrode overlapping each other with the bank defining the light emitting area there-between may be reduced, deterioration of display quality may become a serious problem due to the mutual interference between them. In order to overcome this problem, it is necessary to develop an electroluminescence display having a new structure.

SUMMARY

The purpose of the present disclosure, as for solving the problems described above, is to provide an electroluminescence display having an ultra-high resolution with high display quality. Another purpose of the present disclosure is to provide an ultra-high resolution electroluminescence display having a structure in which signal interference is reduced by removing parasitic capacitance between wires or lines even when the resolution is increased. Still another purpose of the present disclosure is provided to an ultra-high resolution electroluminescence display maintaining excellent display quality even at ultra-high resolution by eliminating the signal interference between the common electrode and the data lines.

In order to accomplish the above mentioned purposes of the present disclosure, an electroluminescence display according to the present disclosure comprises: a first bank having a first height and a second bank having a second height less than the first height for defining an emission area on a substrate; an anode electrode disposed at the emission area; a light emitting layer disposed on the anode electrode in the emission area; a cathode electrode disposed on the light emitting layer; a first protective layer disposed on the cathode electrode; and a dummy light emitting layer disposed on the second bank. The cathode electrode is disposed on the dummy light emitting layer on the second bank excepting the first bank.

In one embodiment, the electroluminescence display further comprises a second protective layer disposed on the first protective layer.

In one embodiment, the light emitting layer is extended on the first bank and connected to the dummy light emitting layer.

In one embodiment, the cathode electrode is extended from the emission area to an upper portion of the second bank.

In one embodiment, the first bank is extended to a first direction on the substrate, and a plurality of the first banks is parallelly arrayed along to a second direction perpendicular to the first direction. The second bank is extended to the second direction and a plurality of the second banks is parallel arrayed along to the first direction.

In one embodiment, the first bank and the second bank surround the emission area, and are alternately arrayed along to the first direction and the second direction.

In one embodiment, the first banks are separated from each other along to the second direction with a first gap corresponding to the emission area. The second banks are separated from each other along to the first direction with a second gap corresponding to the emission area.

In one embodiment, sides next to the emission area along the first direction have only the first bank. Sides next to the emission area along the second direction have the first bank and the second bank mixed with each other.

In one embodiment, the second height is selected in a range of 30% to 80% of the first height.

In one embodiment, the electroluminescence display further comprises: an encapsulation layer covering the whole of the substrate on the first protective layer and the cathode electrode.

In addition, an electroluminescence display comprises: a plurality of anode electrodes arrayed in a matrix manner on a substrate; a plurality of banks defining an emission area on each anode electrode, and including protrusions having a first height and depressions having a second height; a light emitting layer disposed at the emission area and the depressions; a cathode electrode disposed on the light emitting layer excepting the protrusions; and an encapsulation layer disposed on the protrusions and the cathode electrode.

In one embodiment, the bank surrounding the emission area includes the protrusions and the depressions alternately disposed each other.

In one embodiment, the bank disposed at first sides in a first direction includes the protrusions only. The bank disposed at second sides in a second direction perpendicular to the first direction includes the protrusions and the depressions.

In one embodiment, the bank disposed at first sides in a first direction includes the protrusions excepting the depressions. The bank disposed at second sides in a second direction perpendicular to the first direction includes the depressions excepting the protrusions.

In one embodiment, the cathode electrode is extended from the emission area to upper portions of the protrusions.

In one embodiment, the electroluminescence display further comprises: a first protective layer disposed on the cathode electrode and under the encapsulation layer; and a second protective layer disposed on the first protective layer and under the encapsulation layer.

In one embodiment, the first protective layer is extended from the emission area to the depressions.

In one embodiment, the second protective layer is extended from the emission area to the depressions.

In one embodiment, a ratio between the first height and the second height is selected in a range of 10:3 to 10:8.

The electroluminescent display according to the present disclosure may implement an ultra-high resolution with excellent display quality. As realizing ultra-high resolution, the distance between pixels is gradually reduced, and accordingly, the height of the bank defining the light emitting area is lowered. An electroluminescence display according to the present disclosure may have a structure in which an overlapping area of a data line formed under a bank and a common electrode formed on the bank is minimized even in an ultra-high resolution condition. Therefore, parasitic capacitance between the data line and the common electrode may not occur at an ultra-high resolution. As the result, the electroluminescence display according to the present disclosure may maintain excellent display quality even in an ultra-high resolution structure.

In addition to the effects of the present disclosure mentioned above, other features and advantages of the present disclosure may be described below, or may be clearly understood by those skilled persons in this art from such below descriptions and explanations.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
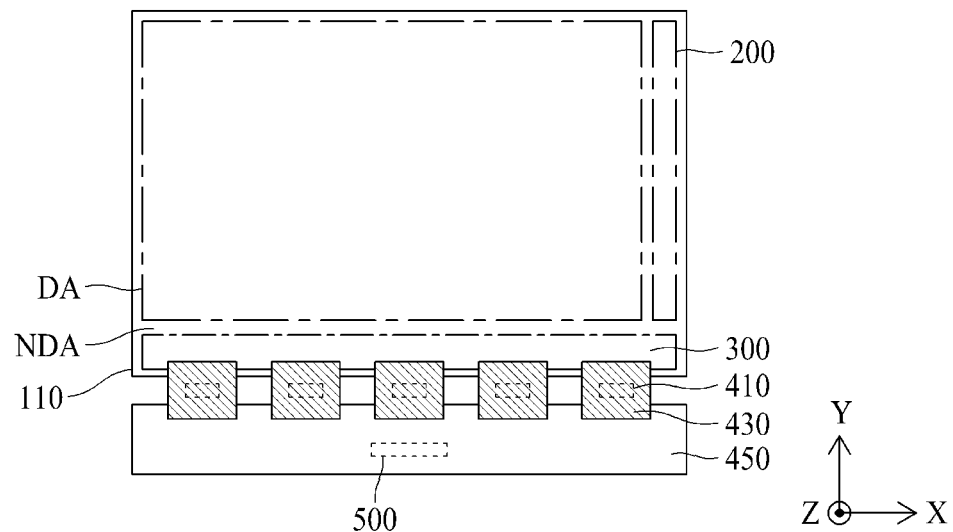
FIG. 1 is a diagram illustrating a schematic structure of an electroluminescence display according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that similar reference numerals already used to denote similar elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

Hereinafter, referring to figures, we will explain the present disclosure in detail. FIG. 1 is a diagram illustrating a schematic structure of an electroluminescence display according to one embodiment of the present disclosure. In FIG. 1, X-axis may be parallel to the extending direction of the scan line, Y-axis may be parallel to the extending direction of the data line, and Z-axis may represent the thickness direction of the display.

Referring to FIG. 1, the electroluminescence display comprises a substrate 110, a gate (or scan) driver 200, a data pad portion 300, a source driving IC (Integrated Circuit) 410, a flexible circuit film 430, a circuit board 450, and a timing controller 500.

The substrate 110 may include an electrical insulating material or a flexible material. The substrate 110 may be made of glass, metal or plastic, but it is not limited thereto. When the electroluminescence display is a flexible display, the substrate 110 may be made of flexible material such as plastic. For example, the substrate 110 may include a transparent polyimide material.

The substrate 110 may include a display area DA and a non-display area NDA. The display area DA, which is an area for representing the video images, may be defined as the majority middle area of the substrate 110, but it is not limited thereto. In the display area DA, a plurality of scan lines (or gate lines), a plurality of data lines and a plurality of pixels may be formed or disposed. Each of the pixels may include a plurality of sub-pixels. Each of the sub-pixels includes the scan line and the data line, respectively.

The non-display area NDA, which is an area not representing the video images, may be defined at the circumference areas of the substrate 110 surrounding all or some of the display area DA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA outside of the display area DA on the substrate 110, as a GIP (gate driver in panel) type. GIP type means that the gate driver 200 is directly formed on the substrate 110.

The data pad portion 300 may supply the data signals to the data line according to the data control signal received from the timing controller 500. The data pad portion 300 may be made as a driver chip and mounted on the flexible circuit film 430. Further, the flexible circuit film 430 may be attached at the non-display area NDA outside of the display area DA on the substrate 110, as a TAB (tape automated bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a COF (chip on film) or COP (chip on plastic) type.

The flexible circuit film 430 may include a plurality of first link lines connecting the data pad portion 300 to the source driving IC 410, and a plurality of second link lines connecting the data pad portion 300 to the circuit board 450. The flexible circuit film 430 may be attached to the data pad portion 300 using an anisotropic conducting film, so that the data pad portion 300 may be connected to the first link lines of the flexible circuit film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

First Embodiment

Figure 2:
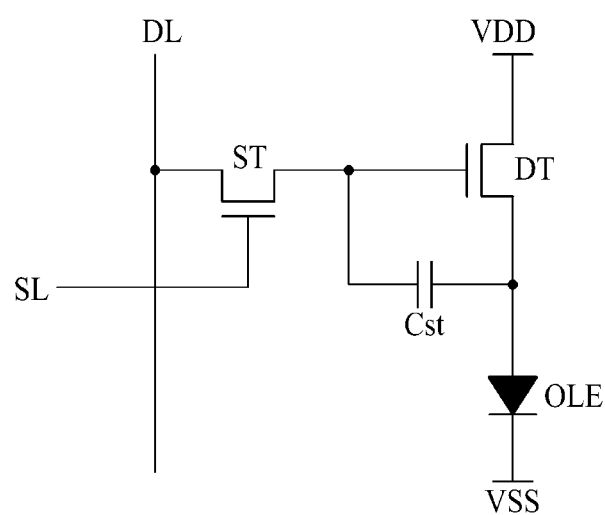
FIG. 2 is a circuit diagram illustrating a structure of one pixel according to one embodiment of the present disclosure.
Figure 3:
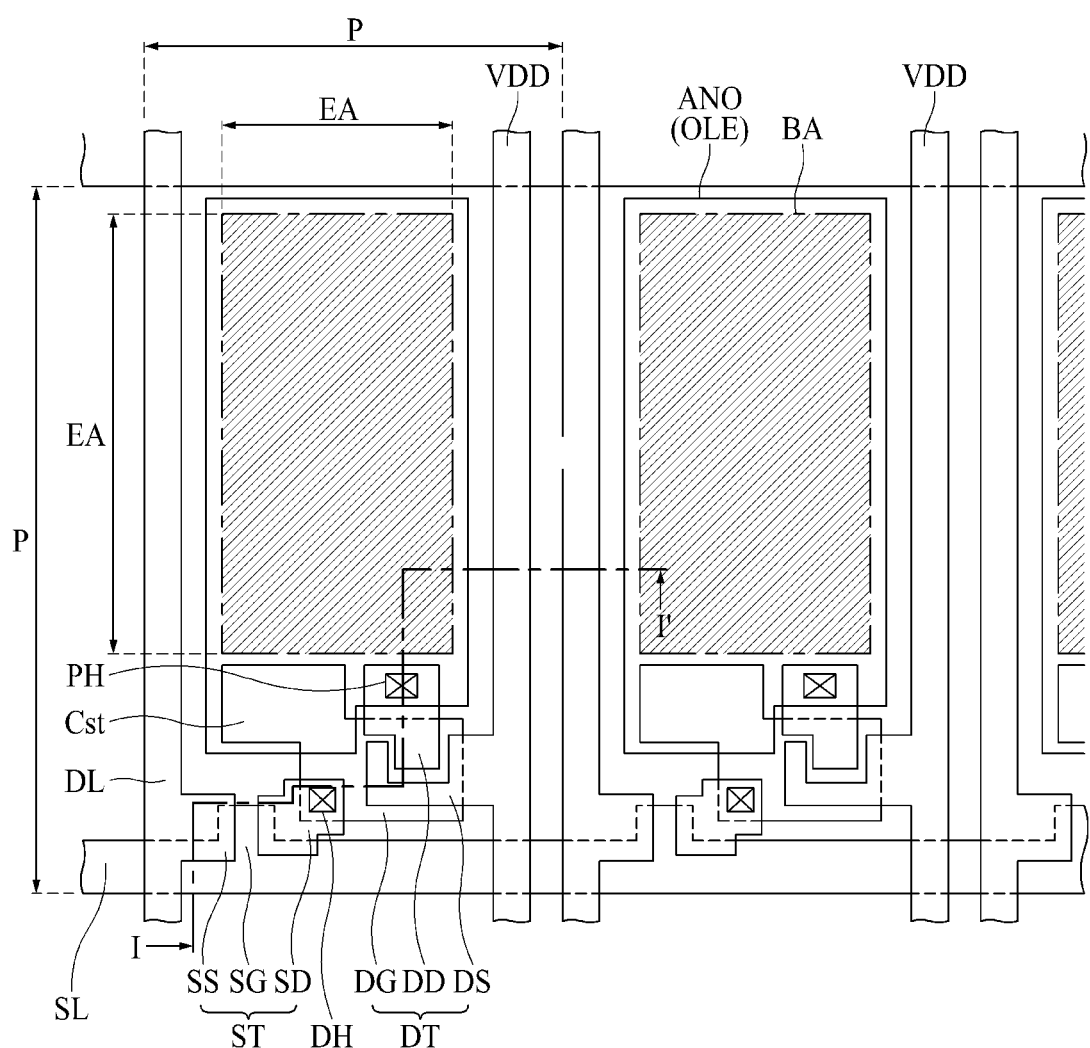
FIG. 3 is a plan view illustrating a structure of the pixels according to one embodiment of the present disclosure.
Figure 4A:
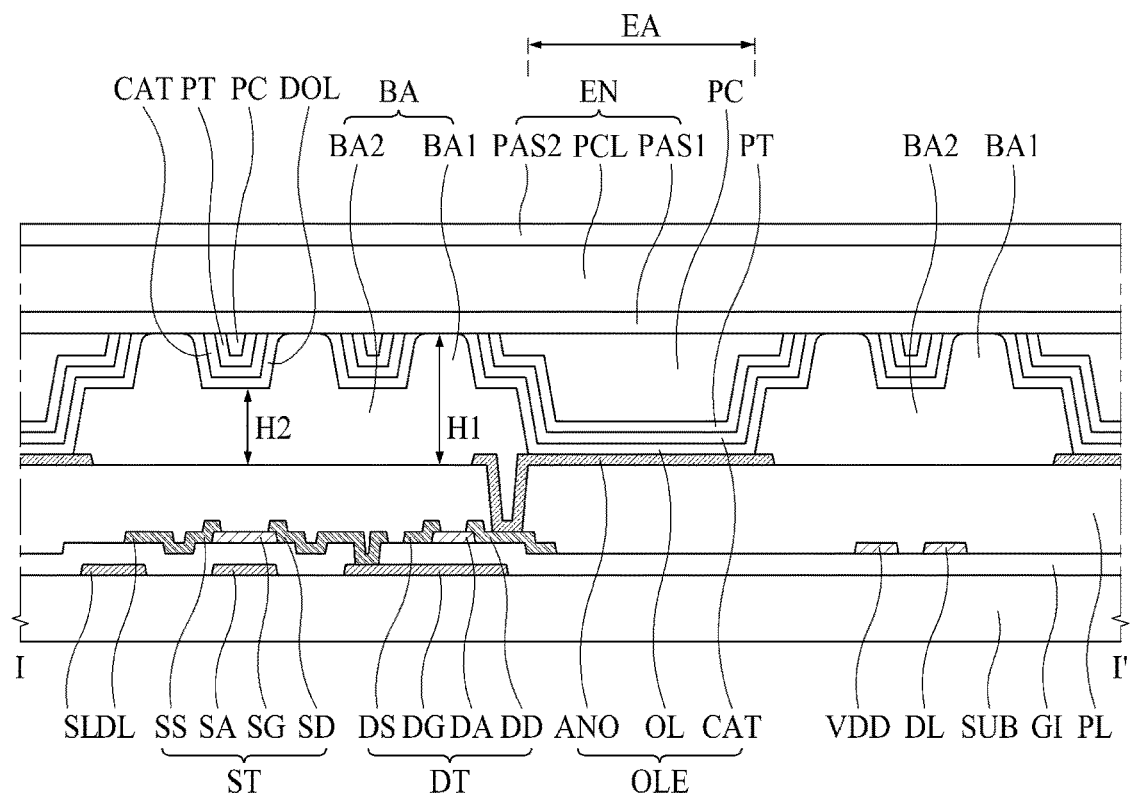
FIG. 4A is a cross-sectional view along to cutting line I-I' in FIG. 3, for illustrating the structure of the electroluminescent display according to a first embodiment of the present disclosure.

Hereinafter, referring to FIGS. 2 to 4B, an electroluminescence display according to the first embodiment of the present disclosure will be explained. FIG. 2 is a circuit diagram illustrating a structure of one pixel according to one embodiment of the present disclosure. FIG. 3 is a plan view illustrating a structure of the pixels according to one embodiment of the present disclosure. FIG. 4A is a cross-sectional view along to cutting line I-I' in FIG. 3, for illustrating the structure of the electroluminescent display according to a first embodiment of the present disclosure. Referring to FIGS. 2 to 4B, we will explain the example of the present disclosure using an organic light emitting display, one embodiment of the luminescence display apparatus.

Referring to FIGS. 2 to 4B, one pixel P of the electroluminescence display may be defined by a scan line SL, a data line DL and a driving current line VDD. One pixel of the electroluminescence display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate SUB. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play the role of selecting a pixel which would be driven.

The driving thin film transistor DT may play a role of driving the light diode OLED of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. The driving source electrode DS may be connected to the driving current line VSS, and the driving drain electrode DD may be connected to an anode electrode ANO of the light emitting diode OLE. A storage capacitance Cst may be disposed between the overlapped portions of the driving gate electrode DG of the driving thin film transistor DT and the anode electrode ANO of the light emitting diode OLE.

Figure 4B:
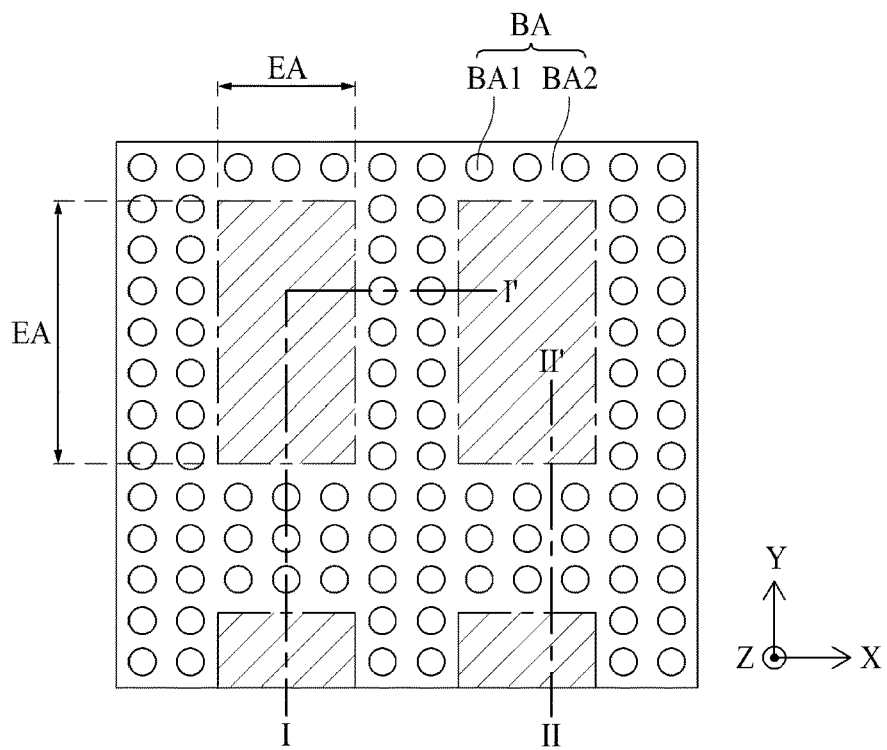
FIG. 4B is a plan view illustrating an enlarged bank portion in FIG. 2 of an electroluminescence display according to the first embodiment of the present disclosure

As shown in FIG. 4B, the switching thin film transistor ST and the driving thin film transistor DT may have the bottom gate structure in which the gate electrodes SG and DG are firstly formed on the substrate SUB. In this case, the gate insulating layer GI is stacked over the gate electrodes SG and DG, the semiconductor layers SA and DA are formed on the gate insulating layer GI. Further, at each of both sides of the semiconductor layers SA and DA, the source electrodes SS and DS and the drain electrodes SD and DD are respectively formed. However, it is not limited thereto. The switching thin film transistor ST and the driving thin film transistor DT may have the top gate structure.

A planarization layer PL may be deposited over the switching thin film transistor ST and the driving thin film transistor DT. The planarization film PL may be for leveling the upper surface of the substrate SUB after forming the thin film transistors ST and DT on the substrate SUB. In order to ensure the flatness of the surface, the planarization layer PL is preferably formed of organic material. In some cases, the planarization layer PL may have a structure in which at least one inorganic layer made of an inorganic material and at least one organic layer made of organic material is stacked.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer OL and a cathode electrode CAT. The light emitting diode OLE may emit the light according to the amount of the electric current controlled by the driving thin film transistor DT. In other words, the amount of light from the light emitting diode OLE may be controlled by the electric current adjusted by the driving thin film transistor DT. The anode electrode ANO of the light emitting diode OLE is connected to the driving drain electrode DD of the driving thin film transistor DT. The cathode electrode CAT is connected to the low voltage line VSS supplied with the low driving voltage. That is, the light emitting diode OLE may be driven by the voltage differences between the low-level voltage and the high-level voltage controlled by driving thin film transistor DT.

The anode electrode ANO may be formed on the planarization layer PL covering the thin film transistors ST and DT. The anode electrode ANO may be connected to the driving drain electrode DD of the driving thin film transistor DT through a contact hole formed at the planarization layer PL. The anode electrode ANO may be disposed as corresponding to the emission area EA.

The relationship between the anode electrode ANO and the emission area EA may be explained as follows. The electroluminescence display according to the present disclosure may include a plurality of pixels P arrayed on the substrate SUB in a matrix manner One pixel P may have one emission area EA. The emission area EA may be defined as a region where the light emitting diode OLE is formed. According to the first embodiment of the present disclosure, the emission area EA may be defined by the bank BA.

Referring to FIGS. 4A and 4B, the explanation of the present disclosure may be focused on the bank BA. The bank BA may include a first bank BA1 and a second bank BA2.

The first bank BA1 may have a first height H1. The second bank BA2 may have a second height H2 less than the first height H1. In other words, the bank BA may include a protrusion having a first height H1 and a depression having a second height H2. For example, the ratio of the first height H1 and the second height H2 may be any selected in a range of 10:3 to 10:8. In one embodiment, the ratio of the first height H1 and the second height H2 may be 2:1 (or, 10:5).

The ratio range of the first height H1 and the second height H2 provided by the present disclosure is not limited thereto. This ratio range is just suggested as considering the various specifications of the electroluminescence displays. In some specific cases, the ratio range may be 10:1 to 10:2, or 10:9. An important factor for defining the ratio range is that the cathode electrode CAT should be removed on the first bank BA1 and, at the same time, the cathode electrode CAT should remain on the second bank BA2.

In one example, the bank BA having the first bank BA1 and the second bank BA2 may be formed by forming the protrusion having the first height H1, and then forming the depression having the second height H2 at some portions of the protrusion. In another example, by depositing a bank material on the substrate SUB having the anode electrode ANO, and then patterning the bank material with a half-tone mask, the first bank BA1 and the second bank BA2 may be formed. In still another example, a plurality of the first bank BA1 are formed as configuring one bank BA wherein each of the first banks BA1 has a higher height than the first height H1 and is arrayed with a narrow gap. After that, by conducting a heat treatment process, the height of the first bank BA1 may be lowered to the first height H1 and the second bank BA2 having the second height H2 may be formed between two first banks BA1.

Then, the stacking structure in the emission area EA will be explained. A light emitting layer OL may be deposited on the anode electrode ANO. The cathode electrode CAT may be deposited on the light emitting layer OL. A first protecting layer is deposited on the cathode electrode CAT. The first protecting layer PT may be made of an inorganic material. For example, the first protecting layer PT may be made of silicon oxide (SiOx), silicon nitride (SiNx) or silicon oxynitride (SiNO).

A second protecting layer PC may be deposited on the first protecting layer PT. The second protecting layer PC may be made of organic material. For example, the second protecting layer PC may be made of polyimide or polyethylene. In one embodiment, the second protecting layer PC may have the same thickness (or height) as that of the first bank BA1.

On the first bank BA1, the cathode electrode CAT, the first protecting layer PT and the second protecting layer PC are not deposited. In the figure, the light emitting layer OL may not be deposited on the first bank BA1. However, in some cases, the light emitting layer OL may be deposited on the first bank BA1. In any case, the cathode electrode CAT should not be deposited on the first bank BA1.

On the second bank BA2, a dummy light emitting layer DOL may be deposited. The dummy light emitting layer DOL may be a portion of the light emitting layer OL extended from the emission area EA. As this extended light emitting layer on the second bank BA2 does not generate the light, it is named as the dummy light emitting layer DOL. On the dummy light emitting layer DOL, the cathode electrode CAT is deposited. The cathode electrode CAT deposited on the dummy light emitting layer DOL is extended from the emission area EA. That is, the cathode electrode CAT may be electrically connected between each emission areas EA by the second bank BA2.

On the second bank BA2, the first protecting layer PT is deposited on the cathode electrode CAT. Further, the second protecting layer PC is deposited on the first protecting layer PT. However, it is not limited thereto. On the second bank BA2, the cathode electrode CAT remains only. For example, when the height of the second bank BA2 is 80% of the height of the first bank BA1, the depression, the height different portion between the first bank BA1 and the second bank BA2, may be filled with the dummy light emitting layer DOL and the cathode electrode CAT. In one embodiment, at least the cathode electrode CAT is disposed on the second bank BA2. As the result, all cathode electrodes CAT disposed on the emission area EA may be connected to each other through the cathode electrode CAT disposed on the second bank BA2.

In addition, an encapsulation layer EN may be deposited on the first bank BA1, the second bank BA2 and the emission area EA. For example, the encapsulation layer EN may include an organic material and a plurality of moisture absorbers dispersed in the organic material. For another example, the encapsulation layer EN may include a first inorganic layer PAS1, an organic layer PCL and a second inorganic layer PAS2 which are sequentially stacked. Here, the first inorganic layer PAS1 and the second inorganic layer PAS2 may be for preventing or at least reducing moisture and gas from penetrating the light emitting element. The first inorganic layer PAS1 and the second inorganic layer PAS2 may be made of silicon oxide or silicon nitride having a thickness of 500 nm to 1,000 nm. The organic layer PCL may include an organic material for covering or burying the solid foreign materials, so it may have a relatively thicker thickness of 10 μm.

The following description is for explaining a process for manufacturing an electroluminescence display according to the present disclosure in which the first bank BA1, the second bank BA2, and the emission area EA have different stacking structures from each other, as shown in FIG. 4A. The light emitting layer OL may be deposited on the substrate SUB having the first bank BA1 and the second bank BA2. The cathode electrode CAT may be deposited on the light emitting layer OL. After that, the first protective layer PT may be deposited thereon. And then, depositing an organic material with a thickness of 5~10 μm to form the second protective layer PC. The organic material may flatten the surface of the substrate SUB having height differences after depositing the first protective layer PT. After that, the surface of the substrate SUB may be etched until the top surface of the first bank BA1 is exposed.

As the result, as shown in FIG. 4A, the top surface of the first bank BA1 may be exposed. The second protective layer PC may remain at the emission area EA. At the second bank BA2, the dummy light emitting layer DOL, the cathode electrode CAT, the first protective layer PT and/or some of the second protective layer PC may remain. In some cases, at the first bank BA1, the light emitting layer may remain. In another example, at the second bank BA2, cathode electrode CAT may remain without any others thereon.

With FIG. 4B, the structure of bank BA in a plan view will be explained. The cutting line I-I' in FIG. 4B may be set in the same place as the cutting line I-I' in FIG. 3. Referring to FIG. 4B, the emission area EA may have a rectangular shape. The emission area EA may be defined by the bank BA. That is, as the bank BA may be disposed at the left side, right side, upper side and the lower side of the emission area EA, the bank BA may surround the emission area EA.

As shown in FIGS. 4A and 4B, the first bank BA1 may be formed in an island shape such as a cylinder (or circular pillar), and a plurality of cylinders may be arrayed with a predetermined pattern. For example, on the second bank BA2 having the second height H2, a plurality of first banks BA1 having the first height H1 may be arrayed with a predetermined distance. In FIG. 4B, the first bank BA1 has the cylinder shape, but it is not limited thereto. The shape of the first bank BA1 in a plan view may be any of various polygonal shapes.

Figure 4C:
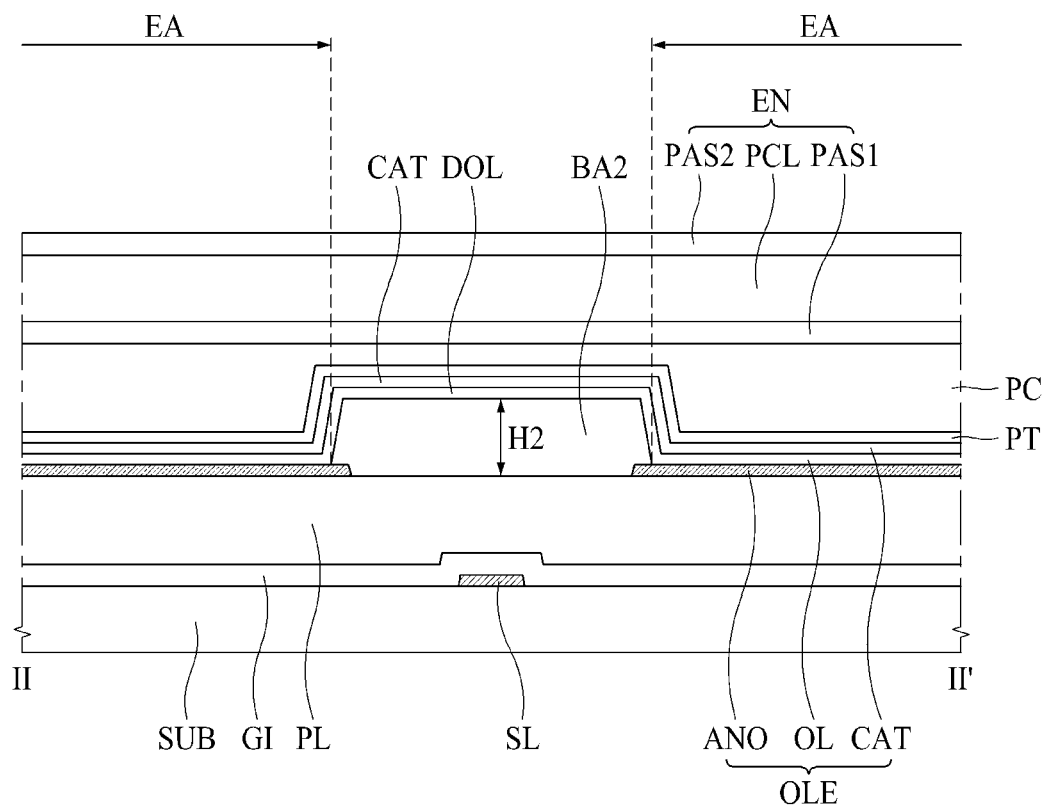
FIG. 4C is a cross-sectional view along to cutting line II-II' in FIG. 4B according to the first embodiment of the present disclosure.

Hereinafter, referring to FIG. 4C, the structure for connecting the cathode electrode CAT formed at one of the emission areas EA to the cathode electrode CAT formed at another emission area EA through the second bank BA2. FIG. 4C is a cross-sectional view along the cutting line II-II' in FIG. 4B.

Referring to FIG. 4C, at the emission area EA, the light emitting diode OLE may be formed by stacking the anode electrode ANO, the light emitting layer OL and the cathode electrode CAT sequentially. Between two neighboring emission areas EA along the Y-axis, the second bank BA2 may be disposed. The second bank BA2 has the second height H2. The second height H2 is less than the first height H1 of the first bank BA1. Therefore, on the second bank BA2, the dummy light emitting layer DOL and the cathode electrode CAT may be deposited sequentially. The dummy light emitting layer DOL may be connected to the light emitting layer OL in the emission area EA. Further, the cathode electrode CAT may be extended and connected from one of the emission areas EA to another emission area EA passing through the second bank BA2.

On the cathode electrode CAT, the first protective layer PT and the second protective layer PC are deposited sequentially. In particular, since the second protective layer PC is deposited with relatively thick thickness and then being etched down to the top surface of the first bank BA1, the second protective layer PC may remain with a relatively thick thickness on the emission area EA, but may remain with a relatively thin thickness on the second bank BA2. In FIG. 4C, the first protective layer PT and the second protective layer PC are stacked, but in some cases, only the first protective layer PT may be remained according to the height of the second bank BA2. Otherwise, the second protective layer PC2 may be removed at the second bank BA2. However, in any case, on the second bank BA2, the cathode electrode CAT should remain. Furthermore, the cathode electrode CAT at the second bank BA2 should be extended and connected to the cathode electrode CAT at the emission area EA.

At the left side and the right side of the emission area EA, the data line DL and/or the driving current line VDD may be disposed. To the data line DL, data voltages may be supplied as varying from time to time. To the driving current line VSS, high voltage may always be applied. When the cathode electrode CAT may be disposed as being continuously connected state on the banks BA disposed at the left side and right side of the emission area EA, the voltage supplied to the data line DL may be fluctuated by the parasitic capacitance between the cathode electrode CAT and the data line DL. Further, the voltage supplied to the driving current line VDD or the voltage supplied to the cathode electrode CAT may be varied by the parasitic capacitance between the cathode electrode CAT and the driving current line VDD. As the result, the video quality may be degraded. This degradation may be a severe problem at the electroluminescence display having an ultra-high density of 4K or 8K (or, higher than 200 PPI; pixel per inch).

However, according to the first embodiment of the present disclosure, at the banks BA disposed at the left side and the right side of the emission area EA, the cathode electrode CAT is disposed on the second bank BA2. Therefore, the parasitic capacitances between the cathode electrode CAT and the data line DL and between the cathode electrode CAT and the driving current line VDD may be reduced. So, the electroluminescence display according to the first embodiment of the present disclosure has no degradation of video quality due to the interference between the lines with the ultra-high density structure.

In addition, at the lower side and upper side of the emission area EA, the scan line SL or the reference line (not shown in figures) may be disposed. Having the same structure of the bank BA at the lower side and the upper side of the emission area, there is no degradation of video quality by reducing the interference between the lines disposed under the bank and the cathode electrode CAT disposed over the bank.

Second Embodiment

Figure 5A:
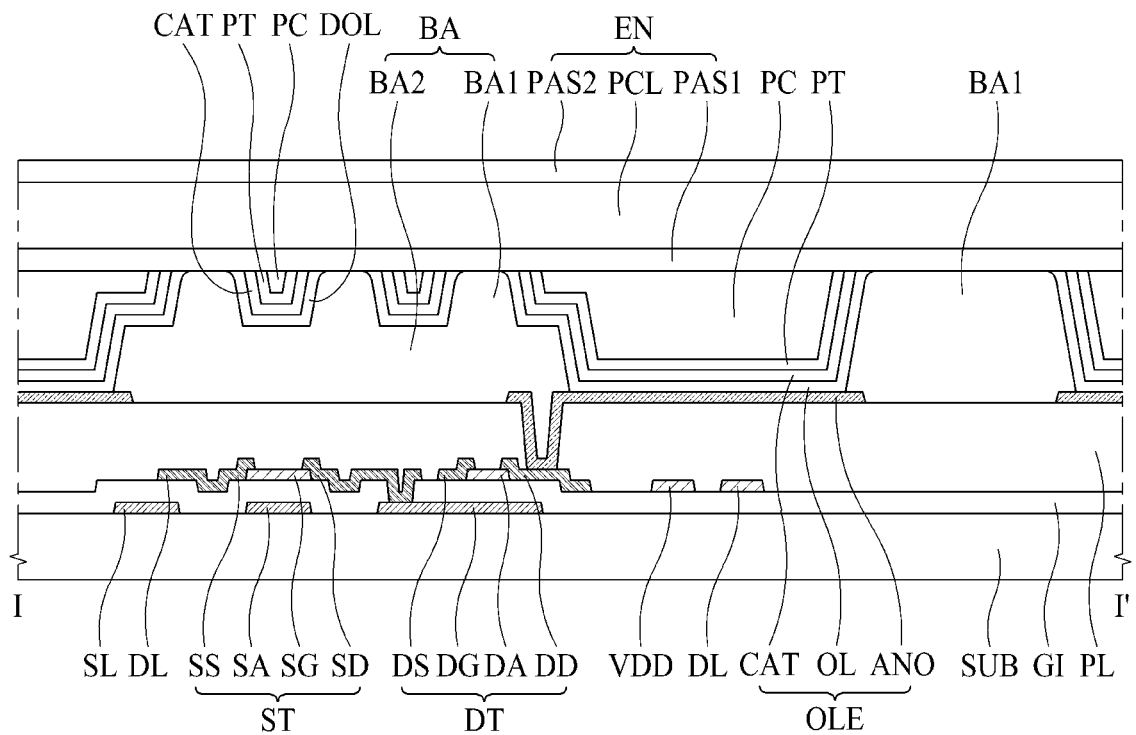
FIG. 5A is a cross-sectional view along to cutting line I-I' in FIG. 3, for illustrating a structure of the electroluminescent display according to a second embodiment of the present disclosure.
Figure 5B:
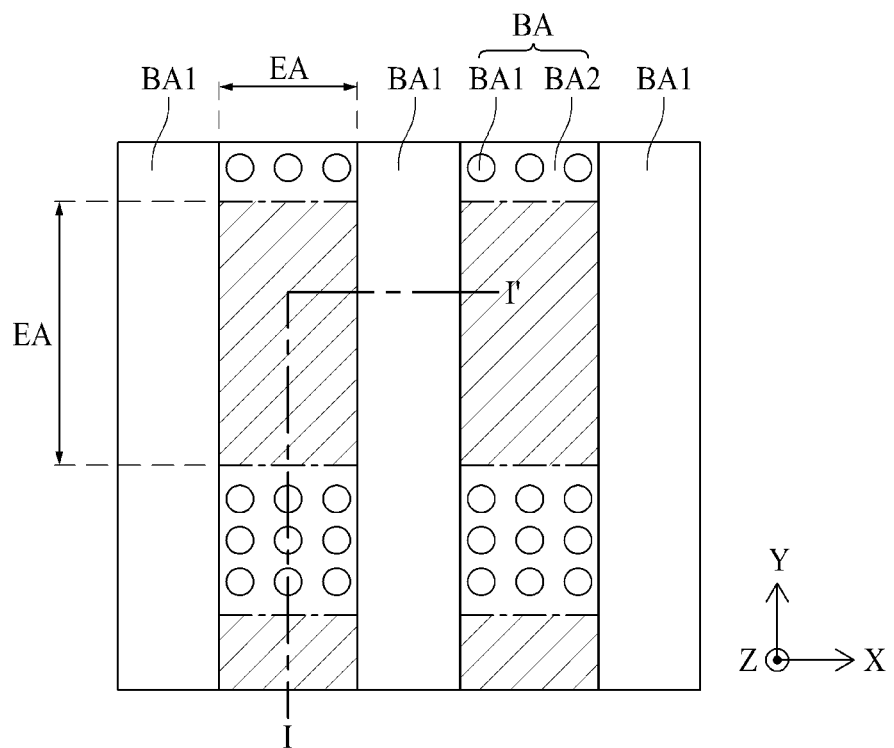
FIG. 5B is a plan view illustrating an enlarged bank portion in FIG. 2 of an electroluminescence display according to the second embodiment of the present disclosure.

Hereinafter, referring to FIGS. 5A and 5B, an electroluminescence display according to the second embodiment of the present disclosure will be explained. FIG. 5A is a cross-sectional view along to cutting line I-I' in FIG. 3, for illustrating a structure of the electroluminescent display according to the second embodiment of the present disclosure. FIG. 5B is a plan view illustrating an enlarged bank portion in FIG. 2 of an electroluminescence display according to the second embodiment of the present disclosure. The cutting line I-I' in FIG. 5B may be set along with the same positions of cutting line I-I' in FIG. 3.

An electroluminescence display according to the second embodiment may have a similar structure to the first embodiment. The difference may be in the structure of the bank BA. Therefore, the description for the same element may not be duplicated unless necessary.

Referring to FIGS. 5A and 5B, a plurality of anode electrode ANO may be arrayed on the substrate SUB. Each anode electrode ANO has a circumference region covered by the bank BA and a middle region exposed and surrounded by the bank BA. The exposed region of the anode electrode ANO may be defined as an emission area EA.

The emission area EA may have a rectangular shape. The emission area EA may be defined by the bank BA. As being disposed at the left side, the right side, the upper side and the lower side of the emission area EA, the bank BA may surround the emission area EA.

The bank BA may include a first bank BA1 and a second bank BA2. The first bank BA1 may have a first height H1, and the second bank BA2 may have a second height H2 that is less than the first height H1. For example, the second height H2 may be selected in a range from 30% to 80% of the first height H1.

At the left side and the right side of the emission area EA, only the first bank BA1 is disposed. On the contrary, at the upper side and the lower side of the emission area EA, the first bank BA1 and the second bank BA2 are mixedly arranged. For example, a plurality of the first bank BA1 may be arrayed on the second bank BA2.

At the left side and the right side of the emission area EA, the data line DL and/or the driving current line VDD may be disposed under the first bank BA1. Data voltage varying from time to time may be supplied to the data line DL. Meanwhile, a high-level voltage may be constantly applied to the driving current line VDD.

In order to remove the cathode electrode CAT which may be overlapped with the data line DL and/or the driving current line VDD, the left side and the right side of the emission area EA may have only the first bank BA1 excepting the second bank BA2. As the result, the data line DL and/or the driving current line VDD are not overlapped with the cathode electrode CAT supplied with the common voltage. Therefore, there is no parasitic capacitance between the cathode electrode CAT and the data line DL and between the cathode electrode CAT and the driving current line VDD.

However, when the cathode electrode CAT is also removed on the bank BA disposed at the upper side and the lower side of the emission area EA, the cathode electrode CAT may be formed as an island shape isolated at each emission area EA. Then, the common voltage cannot be supplied to all cathode electrodes CAT, so the organic light emitting diodes OLE may not operate. Therefore, in the second embodiment, the bank BA overlapped with the scan line SL, which has relatively little effect on video quality due to parasitic capacitance, may have the structure in which the first bank BA1 and the second bank BA2 are mixedly arranged.

For example, the scan line SL or the reference line (not shown in figures) may be disposed at the upper side and the lower side of the emission area EA. As explained in the first embodiment, by reducing the signal interference between the cathode electrode CAT disposed on the bank BA and the lines disposed under the bank BA, there is no degradation of the video quality.

In the second embodiment, a plurality of the first banks BA1 may be arrayed such as being extended to Y-axis direction and being separated apart from each other with a gap corresponding to the width of the emission area EA along to X-axis direction. In addition, the second bank BA2 may be arrayed as being extended to X-axis direction and being separated apart from each other with a gap corresponding to the length of the emission area EA along to Y-axis direction. Here, the second bank BA2 is not singly arranged, but mixedly arranged with the first bank BA1.

As the result, each of the cathode electrodes CAT formed at each of the emission areas EA may be physically and electrically disconnected along the X-axis direction by the portions where only the first bank BA1 is disposed, so the signal interference between the cathode electrode CAT and the lines may be removed. At the same time, all cathode electrodes CAT may be physically and electrically connected to each other on the second bank BA2 along the Y-axis direction. This structure may be referred to as the structure in which the common voltage is supplied from the upper side of the substrate SUB to the lower side of the substrate SUB.

In the second embodiment, the first bank BA1 is disposed at the left side and the right side of the emission area EA. For another case in which the data line DL and/or the driving current line may be disposed at the upper side and the lower side of the emission area EA, only the first bank BA1 may be disposed at the upper side and lower side of the emission area EA, and the second bank BA2 with the first bank BA1 may be disposed at the left side and the right side of the emission area EA.

The second embodiment has a feature in which the bank BA disposed at the left side and the right side of the emission area EA may have only the first bank BA1 on which the cathode electrode CAT is not disposed. Therefore, the electroluminescence display according to the second embodiment may have no degradation of video quality due to the interference between the lines and the cathode electrode CAT even with an ultra-high density of the pixels.

Third Embodiment

Figure 6A:
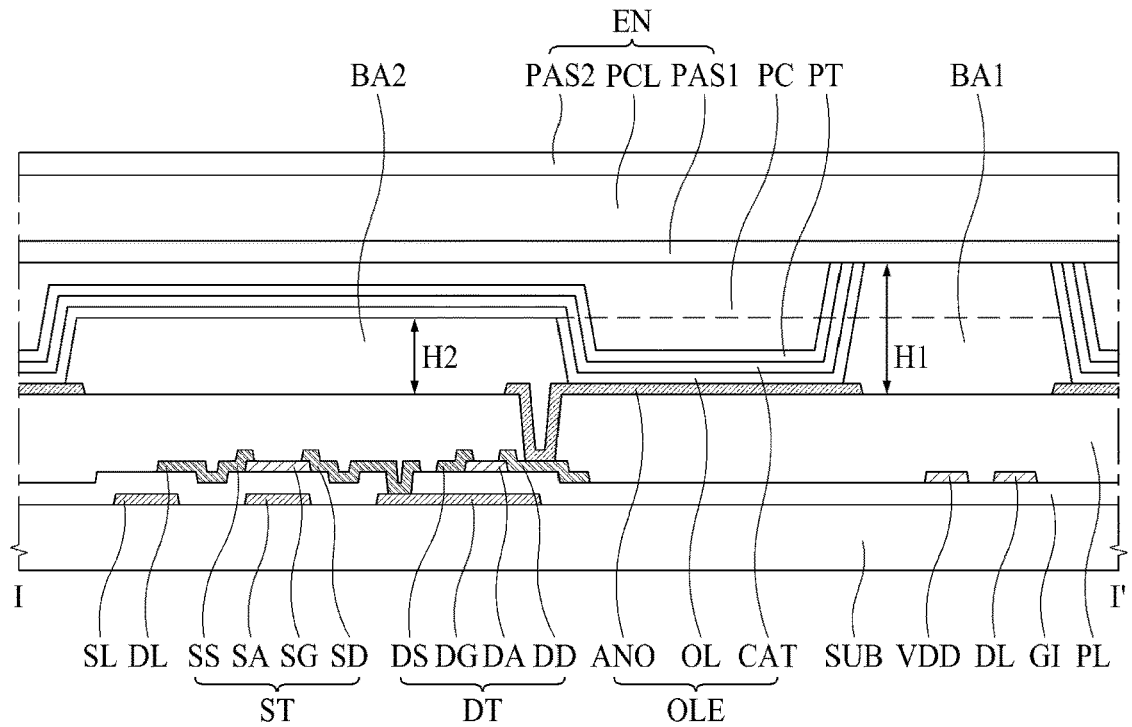
FIG. 6A is a cross-sectional view along to cutting line I-I' in FIG. 3, for illustrating a structure of the electroluminescent display according to a third embodiment of the present disclosure.
Figure 6B:
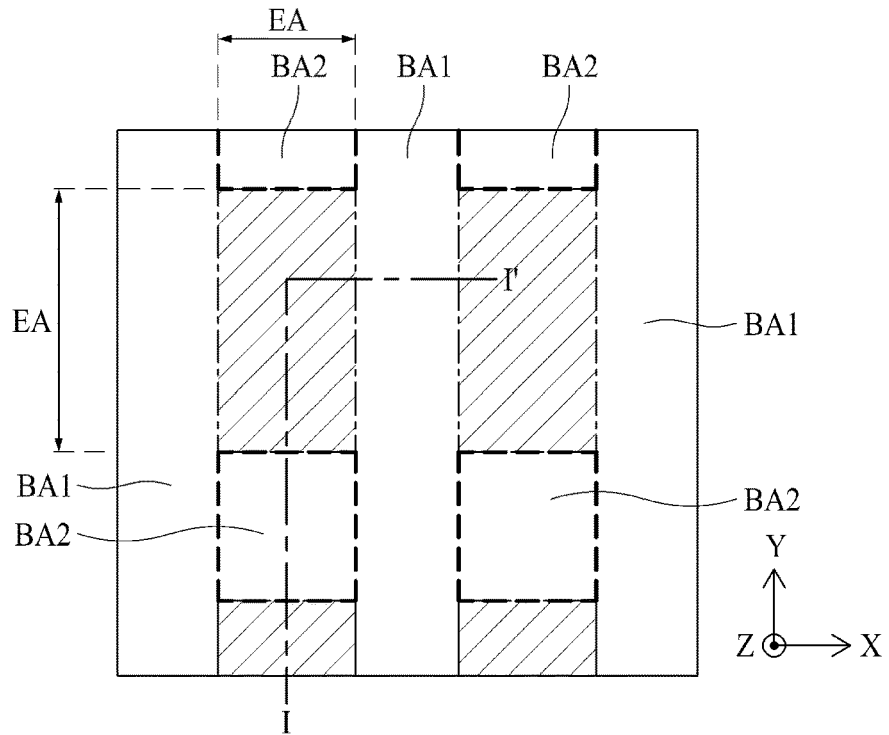
FIG. 6B is a plan view illustrating an enlarged bank portion in FIG. 2 of an electroluminescence display according to the third embodiment of the present disclosure.

Hereinafter, referring to FIGS. 6A and 6B, an electroluminescence display according to the third embodiment of the present disclosure will be explained. FIG. 6A is a cross-sectional view along to cutting line I-I' in FIG. 3, for illustrating a structure of the electroluminescent display according to a third embodiment of the present disclosure. FIG. 6B is a plan view illustrating an enlarged bank portion in FIG. 2 of an electroluminescence display according to the third embodiment of the present disclosure. The cutting line I-I' in FIG. 6B may be set along the same positions of cutting line I-I' in FIG. 3.

Referring to FIGS. 6A and 6B, a plurality of anode electrode ANO may be arrayed on the substrate SUB. Each anode electrode ANO has a circumference region covered by the bank BA and a middle region exposed and surrounded by the bank BA. The exposed region of the anode electrode ANO may be defined as an emission area EA.

The emission area EA may have a rectangular shape. The emission area EA may be defined by the bank BA. As being disposed at the left side, the right side, the upper side and the lower side of the emission area EA, the bank BA may surround the emission area EA.

At the left side and the right side of the emission area EA, only the first bank BA1 having the first height H1 may be disposed. Meanwhile, at the upper side and the lower side of the emission area EA, only the second bank BA2 may be disposed. Here, the second height H2 may be in a range from 30% to 80% of the first height H1.

Each of the plurality of the first banks BA1 may be extended along Y-axis of the substrate SUB. A plurality of the first banks BA1 may be arrayed in X-axis with a predetermined gap. Particularly, the first banks BA1 may be apart from each other with the predetermined gap corresponding to the (lateral) width of the emission area EA.

Meanwhile, each of the plurality of the second banks BA2 may be extended along X-axis of the substrate SUB. A plurality of the second banks BA2 may be arrayed in Y-axis with a predetermined gap. Particularly, the second banks BA2 may be apart from each other with the predetermined gap corresponding to the (longitudinal) length of the emission area EA. Further, each of the first banks BA1 may have a continuously extended line shape. Meanwhile, each of the second banks BA2 may have a plurality of segments which are placed between the first banks BA1 and successively disposed along X-axis.

At the left side and the right side of the emission area EA, only the first bank BA1 is disposed. On the contrary, at the upper side and the lower side of the emission area EA, only the second bank BA2 is arranged. At the left side and the right side of the emission area EA, the data line DL and/or the driving current line VDD may be disposed under the first bank BA1. Data voltage varying from time to time may be supplied to the data line DL. Meanwhile, a high-level voltage may be constantly applied to the driving current line VDD.

In order to remove the cathode electrode CAT which may be overlapped with the data line DL and/or the driving current line VDD, the left side and the right side of the emission area EA may have only the first bank BA1 excepting the second bank BA2. As the result, the data line DL and/or the driving current line VDD are not overlapped with the cathode electrode CAT supplied with the common voltage. Therefore, the cathode electrode CAT may not be affected by the data line DL and the driving current line VDD.

In the third embodiment, the bank BA overlapped with the scan line SL, which has relatively little effect on video quality due to parasitic capacitance, may have the structure in which only the second bank BA2 is arranged. Therefore, the cathode electrodes CAT are physically and electrically connected along Y-axis, so the cathode electrodes CAT may be supplied with the common voltage maintained at a constant level from the common voltage terminals disposed at the upper side and lower side of the substrate SUB. The cathode electrode CAT may have a structure in which they may be physically and electrically disconnected along X-axis but they may be physically and electrically connected along Y-axis.

The third embodiment has a feature in which the bank BA disposed at the left side and the right side of the emission area EA may have only the first bank BA1 on which the cathode electrode CAT is not disposed. Therefore, the electroluminescence display according to the third embodiment may have no degradation of video quality due to the interference between the lines and the cathode electrode CAT even with an ultra-high density of the pixels.

In FIG. 6A, the light emitting layer OL, the cathode electrode CAT, the first protective layer PT and the second protective layer PC are remained on the second bank BA2 disposed at the lower side and the upper side of the emission area EA. However, it is not limited thereto. For example, the light emitting layer OL and the cathode electrode CAT may remain only. For another example, the light emitting layer OL, the cathode electrode CAT and the first protective layer PT may remain excepting the second protective layer PC.

Fourth Embodiment

Figure 7A:
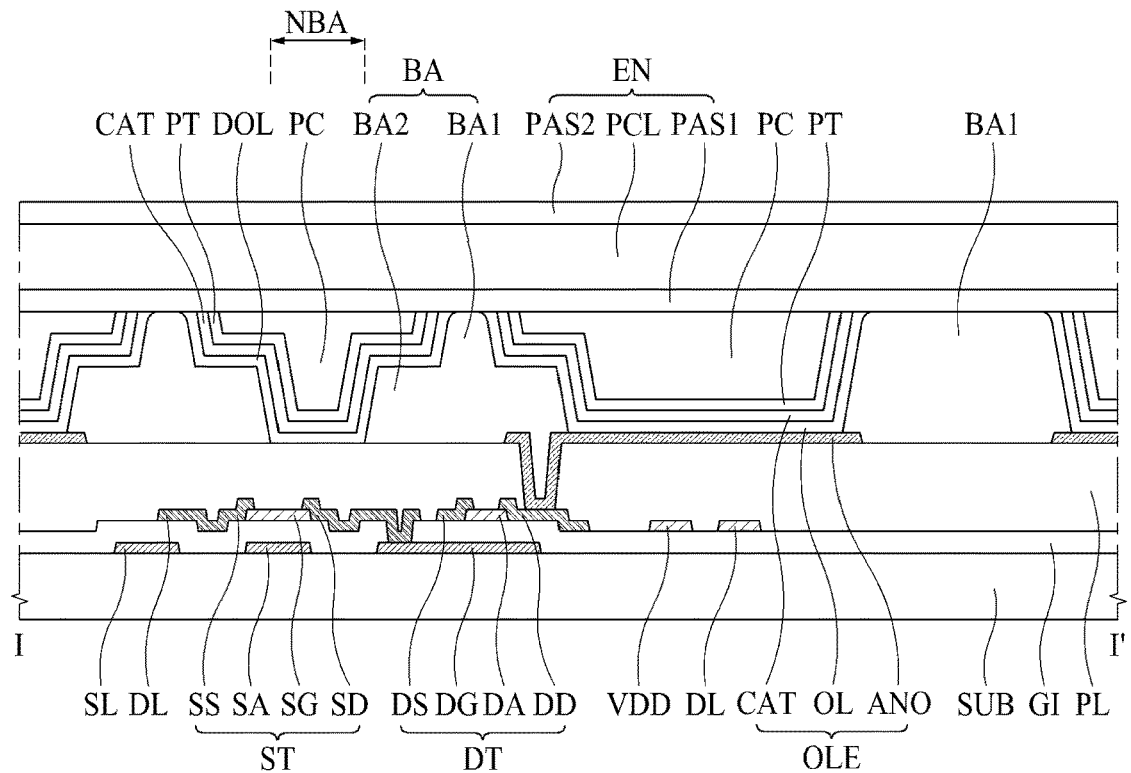
FIG. 7A is a cross-sectional view along to cutting line I-I' in FIG. 3, for illustrating a structure of the electroluminescent display according to a fourth embodiment of the present disclosure.
Figure 7B:
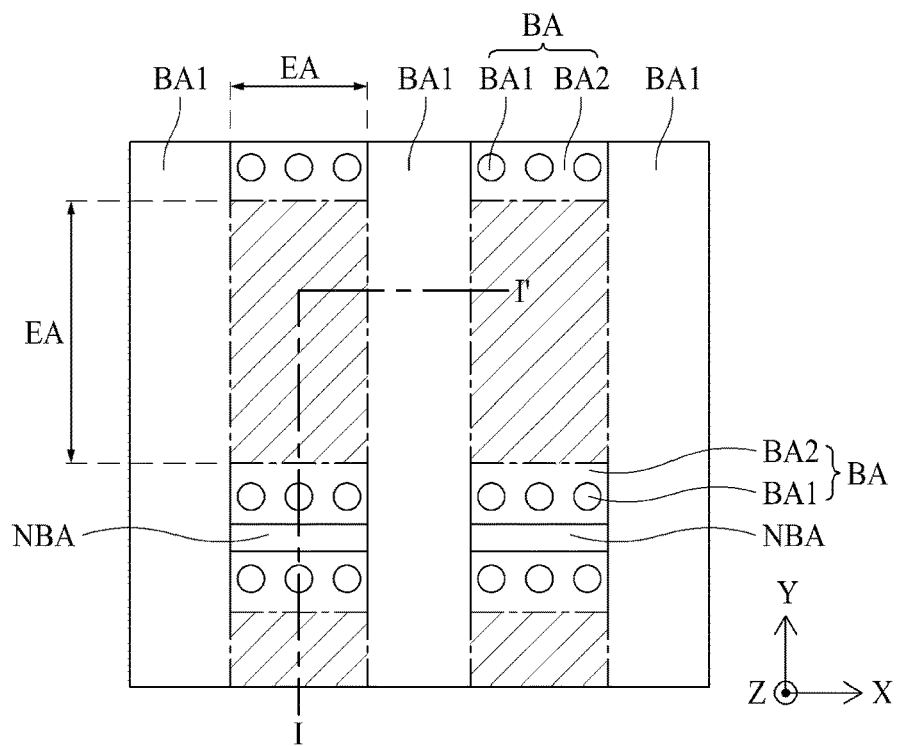
FIG. 7B is a plan view illustrating an enlarged bank portion in FIG. 2 of an electroluminescence display according to the fourth embodiment of the present disclosure.

Hereinafter, referring to FIGS. 7A and 7B, an electroluminescence display according to a fourth embodiment of the present disclosure will be explained. FIG. 7A is a cross-sectional view along to cutting line I-I' in FIG. 3, for illustrating a structure of the electroluminescent display according to the fourth embodiment of the present disclosure. FIG. 7B is a plan view illustrating an enlarged bank portion in FIG. 2 of an electroluminescence display according to the fourth embodiment of the present disclosure.

Referring to FIGS. 7A and 7B, a plurality of anode electrode ANO may be arrayed on the substrate SUB. Each anode electrode ANO has a circumference region covered by the bank BA and a middle region exposed and surrounded by the bank BA. The exposed region of the anode electrode ANO may be defined as an emission area EA.

The emission area EA may have a rectangular shape. The emission area EA may be defined by the bank BA. As being disposed at the left side, the right side, the upper side and the lower side of the emission area EA, the bank BA may surround the emission area EA.

At the left side and the right side of the emission area EA, only the first bank BA1 having the first height H1 may be disposed. Meanwhile, at the middle regions of the upper side and the lower side of the emission area EA, a non-bank area NBA may be formed. Further, at the region next to the emission area EA of the upper side and the lower side of the emission area EA, the first bank BA1 and the second bank BA2 are disposed. In particular, a plurality of the first banks BA1 having island shape is arrayed on the second bank BA2. The second bank BA2 may have a second height H2. Here, the second height H2 may be in arranged from 30% to 80% of the first height H1. In other words, at the upper side (or the lower side) of the emission area EA, the non-bank area NBA may be formed as dividing the upper side (or the lower side) into two regions by the middle regions. The divided two regions, each being disposed between the emission area EA and the non-bank area NBA, may have the first bank BA1 and the second bank BA2 mixedly arranged.

Each of the plurality of the first banks BA1 may be extended along Y-axis of the substrate SUB. A plurality of the first banks BA1 may be arrayed in X-axis with a predetermined gap. Particularly, the first banks BA1 may be apart from each other with the predetermined gap corresponding to the (lateral) width of the emission area EA.

Further, each of the plurality of the second banks BA2 may be extended along X-axis of the substrate SUB. A plurality of the second banks BA2 may be arrayed in Y-axis with a predetermined gap. Particularly, the second banks BA2 may be apart from each other with the predetermined gap corresponding to the (longitudinal) length of the emission area EA. Further, each of the first banks BA1 may have a continuously extended line shape. Meanwhile, each of the second banks BA2 may have a plurality of segments which are placed between the first banks BA1 and successively disposed along X-axis.

At the middle region of the second bank BA2, the non-bank area NBA may be disposed as being extended along X-axis. Therefore, the second bank BA2 may be divided into two regions, so one region may be disposed next to the upper emission area EA and the other region may be disposed next to the lower emission area EA. At the second bank BA2, a plurality of the first banks BA1, each of them having an island shape, may be arrayed.

Since there was no bank BA at the non-bank area NBA, the planarization layer PL may be exposed. On the exposed planarization layer PL, the dummy light emitting layer DOL, the cathode electrode CAT, the first protective layer PT and the second protective layer PC may be sequentially deposited. At the non-bank area NBA, the cathode electrode CAT may have a larger area than the region where the first bank BA1 and the second bank BA2 are disposed together. The cathode electrode CAT may be extended from the emission area EA, passing the second bank BA2, to the non-bank area NBA, so that the cathode electrode CAT may be continuously connected over the emission areas EA along Y-axis.

In order to remove the cathode electrode CAT which may be overlapped with the data line DL and/or the driving current line VDD, the left side and the right side of the emission area EA may have only the first bank BA1 excepting the second bank BA2. As the result, the data line DL and/or the driving current line VDD are not overlapped with the cathode electrode CAT supplied with the common voltage. Therefore, the cathode electrode CAT may not be affected by the data line DL and the driving current line VDD.

In the fourth embodiment, the bank BA overlapped with the scan line SL, which has relatively little effect on video quality due to parasitic capacitance, may have the structure in which the first bank BA1 and the second bank BA2 are mixedly arranged. Therefore, the cathode electrodes CAT are physically and electrically connected along Y-axis, so the cathode electrodes CAT may be supplied with the common voltage maintained at a constant level from the common voltage terminals disposed at the upper side and lower side of the substrate SUB. The cathode electrode CAT may have a structure in which they may be physically and electrically disconnected along X-axis but they may be physically and electrically connected along Y-axis.

As the density of pixel is increasing, the area of the second bank BA2 disposed as being overlapped with the scan line SL may be narrowed. In this case, the connectivity of the cathode electrode CAT may be broken or the line resistance may be partially increased at the portion of the cathode electrode which is overlapped with the scan line SL. Therefore, the common voltage may not be maintained with the predetermined level, so the video quality may be degraded.

However, according to the fourth embodiment, the non-bank area NBA is disposed where the scan line SL is disposed, so it is ensured that the cathode electrode CAT is connected without any defects. Therefore, there is no problem such that the line resistance may be increased at the cathode electrode CAT. The video quality may not be degraded as the pixel density is increased more and more.

The features, structures, effects and so on described in the above examples of the present disclosure are included in at least one example of the present disclosure, and are not limited to only one example. Furthermore, the features, structures, effects and the likes explained in at least one example may be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
    a transistor;
    a planarization layer on the transistor;
    a first bank on the planarization layer and having a first height with respect to an upper surface of the planarization layer and a second bank having a second height with respect to the upper surface of the planarization layer that is less than the first height where the first bank and second bank define an emission area on a substrate, an upper surface of the first bank extending from an upper surface of the second bank;
    an anode electrode disposed at the emission area;
    a light emitting layer disposed on the anode electrode in the emission area;
    a dummy light emitting layer disposed on the upper surface of the second bank;
    a cathode electrode disposed on the light emitting layer and the dummy light emitting layer;
    a first protective layer disposed on the cathode electrode,
    wherein the cathode electrode is disposed on the upper surface of the second bank, except on the upper surface of the first bank,
    wherein the cathode electrode is in contact with the dummy light emitting layer on the second bank, except on the upper surface of the first bank,
    wherein the first protective layer is in contact with the cathode electrode, except on the upper surface of the first bank, and
    wherein portions of the cathode electrode disposed in the emission area are connected across an entirety of the substrate through portions of cathode electrode disposed on the upper surface of the second bank.

2. The electroluminescence display according to claim 1, further comprising:
    a second protective layer disposed on the first protective layer.

3. The electroluminescence display according to claim 1, wherein the light emitting layer is extended on the first bank and connected to the dummy light emitting layer.

4. The electroluminescence display according to claim 1, wherein the cathode electrode is extended from the emission area to an upper portion of the second bank.

5. The electroluminescence display according to claim 1, wherein the first bank is extended in a first direction on the substrate, and a plurality of first banks are parallelly arrayed along a second direction that is perpendicular to the first direction, and
    wherein the second bank is extended to the second direction and a plurality of second banks are parallel arrayed along the first direction.

6. The electroluminescence display according to claim 5, wherein the first bank and the second bank surround the emission area, and are alternately arrayed along the first direction and the second direction.

7. The electroluminescence display according to claim 5, wherein the plurality of first banks are separated from each other along the second direction with a first gap corresponding to the emission area, and
    wherein the plurality of second banks are separated from each other along the first direction with a second gap corresponding to the emission area.

8. The electroluminescence display according to claim 5, wherein sides next to the emission area along the first direction have the first bank but not the second bank, and
    sides next to the emission area along the second direction have the first bank and the second bank mixed with each other.

9. The electroluminescence display according to claim 1, wherein the second height is selected in a range of 30% to 80% of the first height.

10. The electroluminescence display according to claim 1, further comprising:
    an encapsulation layer covering all of the substrate that is on the first protective layer and the cathode electrode.

11. The electroluminescence display according to claim 1, wherein the dummy light emitting layer overlaps the transistor.

12. An electroluminescence display comprising:
    a plurality of anode electrodes arrayed in a matrix on a substrate;
    a plurality of banks defining an emission area on each of the plurality of anode electrodes, the plurality of banks including a plurality of protrusions that extend from an upper surface of one bank from the plurality of banks and have a first height and a plurality of depressions having a second height, each of the plurality of depressions between a pair of protrusions from the plurality of protrusions;
    a light emitting layer disposed at the emission area and the plurality of depressions;

a cathode electrode disposed on an upper surface of each of the plurality of depressions and the light emitting layer but not on an upper surface of each of the plurality of protrusions; and an encapsulation layer disposed on the plurality of protrusions and the cathode electrode, wherein portions of the cathode electrode disposed in the emission area are connected across an entirety of the substrate through portions of cathode electrode disposed on the plurality of depressions, and wherein the encapsulation layer is in contact with the upper surface of each of the plurality of protrusions, except the upper surface of each of the plurality of depressions.

13. The electroluminescence display according to claim 12, wherein a bank from the plurality of banks that surrounds the emission area includes the plurality of protrusions and the plurality of depressions alternately disposed with each other.

14. The electroluminescence display according to claim 12, wherein a bank from the plurality of banks that is disposed at first sides in a first direction includes the plurality of protrusions but not the plurality of depressions, and wherein a bank from the plurality of banks that is disposed at second sides in a second direction perpendicular to the first direction includes the plurality of protrusions and the plurality of depressions.

15. The electroluminescence display according to claim 12, wherein the cathode electrode is extended from the emission area to upper portions of the plurality of depressions.

16. The electroluminescence display according to claim 12, further comprising:
a first protective layer disposed on the cathode electrode and under the encapsulation layer; and
a second protective layer disposed on the first protective layer and under the encapsulation layer.

17. The electroluminescence display according to claim 16, wherein the first protective layer is extended from the emission area to the plurality of depressions.

18. The electroluminescence display according to claim 17, wherein the second protective layer is extended from the emission area to the plurality of depressions.

19. The electroluminescence display according to claim 12, wherein a ratio between the first height and the second height is selected in a range of 10:3 to 10:8.

20. The electroluminescence display according to claim 12, wherein the plurality of depressions are non-overlapping with any of the plurality of anode electrodes.

* * * * *